United States Patent [19]

Nishiguchi

[11] Patent Number: 4,937,226

[45] Date of Patent: Jun. 26, 1990

[54] METHOD FOR PRODUCING A SMALL SUPERCONDUCTING SOLENOID

[75] Inventor: Masanori Nishiguchi, Kanagawa, Japan

[73] Assignee: Sumitomo Electric Industries, Ltd., Osaka, Japan

[21] Appl. No.: 220,166

[22] Filed: Jul. 18, 1988

[30] Foreign Application Priority Data

Jul. 16, 1987 [JP] Japan .................. 62-178036

[51] Int. Cl.$^5$ .................. C03C 15/00; H01L 21/306; C25F 3/12
[52] U.S. Cl. .................. 505/1; 65/31; 156/644; 505/701; 505/728; 505/732
[58] Field of Search .................. 65/31; 505/701, 728, 505/731, 732, 1, 730; 427/62; 204/192.24; 156/644, 643, 654, 657, 656

[56] References Cited

U.S. PATENT DOCUMENTS 4,732,647 3/1988 Aine .................. 156/647

FOREIGN PATENT DOCUMENTS 1027795 4/1966 United Kingdom .
1143185 2/1969 United Kingdom .
1596985 9/1981 United Kingdom .

OTHER PUBLICATIONS

Korbin et al.; Advanced Ceramic Materials, vol. 2, No. 38, Special Issue, 7–1987, pp. 430 and 471–472.
Bao et al.; International J. of Modern Physics B, vol. 1, No. 2 (6/29/87–7/1/87), pp. 535–539, 571–574.
Nagata et al.; Japanese J. of Applied Physics; vol. 26, No. 4, Apr., 1987, p. L410 and vol. 26, No. 5, May, 1987, p. L 738.
Arun Inam et al.; Appl. Phys. Lett. 51 (14), 10-5-87 p. 1112.
Condensed Matter, Europhysics Journal, vol. 64, No. 2, Sep. 1986 (Zurich, Switzerland) J. G. Bednorz & K. A. Muller "Possible High T Superconductivity in the Ba–La–CU–O System" pp. 189–193.
Technische Mitteilungen, vol. 80, No. 8, Sep./Oct. 1987 (Essen, Germany) G. Bogner "Technische Anwendungen der Supraleitung-Anforderrungen an die neuen Hochtemperatur–Supra–leiter" pp. 493–501.

Primary Examiner—Kenneth M. Schor
Attorney, Agent, or Firm—Cushman, Darby & Cushman

[57] ABSTRACT

A large number of small superconducting solenoids are produced on a common substrate simultaneously. Two parallel slits (5) passing through a silicon wafer are dug in such manner that a core (10) is left between the slits and then a superconducting thin film of compound oxide is deposited around the core (10).

12 Claims, 1 Drawing Sheet

METHOD FOR PRODUCING A SMALL SUPERCONDUCTING SOLENOID

BACKGROUND OF THE INVENTION

1. Field of the Invention

The present invention relates to a method for producing a small solenoid, more particularly a superconducting solenoid made of compound oxide type superconducting material.

The small solenoid produced by the method according to the present invention is applicable in particular to a small and light-weight actuator, motor or generator, electromagnetic valve or the like.

The small solenoid according to the present invention may be integrated with active elements and/or passive elements on a common substrate consisting of semiconductor such as a single crystal of silicon.

2. Description of the Related Art

Superconducting coil or solenoid which is realized by metal type superconductor such as Ti-Nb alloy is already known and has been developed for a superconducting magnet or the like.

The critical temperature of the metal type superconductors, however, could not exceed 23.2° K. of $Nb_3Ge$ which which was the highest Tc for all studies for the past ten years and hence usage of liquidized helium (boiling point of 4.2° K.) as cryogen is indispensable to realize superconductivity. Therefore, their actual application is limited to special industrial or scientific fields and still more it is difficult to reduce their size or diameter to less than several 10 mm at the present condition.

Possibility of existence of a new type of superconducting materials having much higher Tc was revealed by Bednorz and Müller who discovered a new oxide type superconductor in 1986 [Z. Phys. B64 (1986) 189]. This new oxide type superconducting material discovered by Bednorz and Müller is $[La,Ba]_2CuO_4$ which is called as the $K_2NiF_4$-type oxide having a crystal structure which is similar to a known perovskite type oxide. The $K_2NiF_4$-type oxides show such a high Tc as 30° K. which is extremely higher than the known superconducting materials. It was also reported in the news parer that C. W. Chu et al. discovered in the United States of America another type of superconducting material having the critical temperature of about 90° K. in Feb. 1987. This superconductor called as YBCO is a compound oxide of Ba-Y system represented by $YBa_2Cu_3O_{7-\delta}$.

From the discovery of the abovementioned new type of compound oxide type superconductors, the realization of high-temperature superconductors which can realize the superconductivity in cheap and easily available liquidized nitrogen have arisen suddenly.

However, the abovementioned compound oxide is a ceramic material so that it is difficult or impossible to adopt directly the conventional technique which is used in the metal type superconductor for producing a solenoid or coil.

Therefore, an object of the present invention is to provide a method for producing a small superconducting solenoid or coil from the compound oxide which possesses a high critical temperature (Tc) at a reduced cost in an industrial scale.

SUMMARY OF THE INVENTION

The present invention provides a method for producing a small superconducting solenoid characterized by the steps comprising making at least two slits passing through a substrate to form a core which is defined by a portion of the substrate between adjacent two slits and deposing a thin film of superconducting material of compound oxide on at least predetermined portions of upper and an lower surfaces of said substrate and on walls of said slits by physical vapour deposition technique so that a ring-shaped superconducting thin film is formed about said core.

The substrate is preferably a wafer which is used in the field of semiconductor such as a silicon wafer or a wafer of gallium-arsenic, aluminum-gallium-arsenic or the like. The material of the substrate is not limited to such semiconductors but also may be any inorganic crystals, ceramics, porcelain, or glass such as strontium titanate ($SrTiO_3$), magnesium oxide (MgO), $Al_2O_3$, sapphire, $SiO_2$, quartz, ZnO or the like providing that they are endurable to the condition such as a temperature during the physical vapour deposition of the compound oxide, and that they can prepare a stable thin film of the compound oxide. The material of the substrate is not limited to insulator but can be electro-conducting metal, since electrical current preferentially pass through the superconductor under superconducting condition.

The slits can be cut by the conventional lithographic technology which is used in the field of semiconductor industry. Namely, at first, the substrate is coated with photoresist and then the photoresist layer is exposed to a predetermined pattern of light. After the patterned photoresist layer is developed and cured, the substrate having the patterned and cured photoresist layer thereon is subjected to etching operation to make the slits which pass through the substrate.

According to a preferred embodiment of the present invention, a plurality of small solenoids are produced simultaneously on a common substrate and then are separated into individual solenoids.

The slit pattern has at least two parallel lines in order to provide a core for solenoid. In other words, the core is produce in the substrate in such manner that each core is delimited by adjacent two slits. In the present invention, a desired number of paired slits can be arranged in any pattern such as a pattern of more than two parallel lines, a pattern of a cross comprising two parallel lines crossed by another two parallel lines which are perpendicular to the former or the like.

In a special embodiment of the present invention, a plurality of parallel slits and a transverse slit which crosses the parallel slits perpendicularly at an intermediate position of the length of the parallel slits are cut in the substrate, so that pairs of cores being faced to each other are cut in the substrate simultaneously. Each core is supported cantilever-fashion in the substrate and will be cut off to prepare separate cores after a superconducting layer is deposited thereabout.

The fine precious slits can be produced by a combination of isotropic etching technique and anisotropic etching technique. For example, the substrate is subjected firstly to the anisotropic etching so that each of the slits or through-holes has such a transverse cross section that opposite ends of the slit are enlarged reverse-conically. And then, the substrate is subjected to the isotropic etching to remove edgy corners on the walls of slits and to dig a through-hole having a smooth wall. Otherwise, the edgy corners cause development of cracking at the slits during the subsequent physical vapour deposition.

The physical vapour deposition may be performed by the conventional technique such as sputtering, vacuum deposition, ion plating or the like by using a vapour source or target which is made of superconducting compound oxide under proper operational conditions which will be described in more detail hereinafter. The critical factors for depositing the superconducting thin film of compound oxide, such as a composition of vapour source, substrate temperature, sputtering pressure or the like should be selected so that the superconductivity is realized in the deposited thin film of compound oxide. In a special case, the superconducting thin film may be prepared also by chemical vapour deposition (CVD) technique.

Since the through-holes or slits are enlarged or tapered outwardly at the opposite ends thereof due to the abovementioned combination of anisotropic etching and isotropic etching, vapourized components or particles of compound oxide can penetrate deeply into the slits, so that a continued thin film of compound oxide is deposited on the walls of the slits. Suitable motion such as rotional motion and/or swing motion may be given to the substrate so that the direction of deposition vary in the course of physical vapour deposition.

A portion on the substrate where the thin film of compound oxide is not required to be deposited may be covered by photoresist, pellicle or the like. The masking of the substrate can be omitted. In this case, a thin film of compound oxide is deposited on the whole upper and lower surfaces of the substrate as well as on the walls of slits at first, and then a part of the deposited thin film layer of compound oxide is removed in such manner that a ring-shaped continuous superconducting thin film of compound oxide is left about a core which is delimited by adjacent two slits.

The superconducting material of which the thin film consists may be a compound oxide represented by the general formula:

$$(\alpha_{1-x}\beta_x)\gamma_y O_z$$

in which $\alpha$ stands for an element selected from IIa group of the Periodic Table, $\beta$ stands for an element selected from IIIa group of the Periodic Table and $\gamma$ stands for an element selected from a group of Ib, IIb, IIIb, IVb and VIII of the Periodic Table, x is an atomic ratio of $\beta$ with respect to $(\alpha+\beta)$ and has a range of $0.1 \leq x \leq 0.9$, and y and z are respective atomic ratios of $\gamma$ and oxygen (O) with respect to $(\alpha_{1-x}\beta_x)$ which is considered to be equal to 1 and each satisfy respective range of $1.0 \leq y \leq 4.0$ and $1 \leq z \leq 5$.

The abovementioned oxides possess preferably perovskite type or quasi-perovskite type crystal structure. The term of quasi-perovskite type means a structure which can be considered to have such a crystal structure that is similar to Perovskite-type oxides and includes an orthorhombically distorted perovskite or a distorted oxygen-deficient perovskite or the like.

It is known that the oxygen deficiency in the crystalline structure of the compound oxide is one of the critical factors for realizing the high Tc (the critical temperature) superconductor of the perovskite type or quasiperovskite type compound oxide. Therefore, the elements $\alpha$, $\beta$, $\gamma$ and oxygen (O) must be within the abovementioned proportions in order to realize the proper crystalline structure and oxygen deficiency.

The element $\alpha$ of IIa group of the Periodic Table is preferably Ba or Sr. From 10 to 80% of Ba or Sr can be substituted by Mg and/or Ca. The element $\beta$ of IIIa group of the Periodic Table is preferably at least one of elements selected from a group comprising Y, La, Gd, Ho, Er, Tm, Yb, Dy, Nd, Sm, Eu and Lu. The element $\gamma$ is Cu (copper) in general. A portion of Cu may be substituted by another element selected from Ib, IIb, IIIb, IVb and VIII groups of the Periodic Table such as Ti, V or the like. Still more, a portion of the oxygen (O) may be substituted by another element such as fluorine.

The superconducting thin films according to the present invention may consists of Ba-Y-Cu system compound oxide, Ba-La-Cu system compound oxide and Sr-La-Cu system compound oxide such as $YBa_2Cu_3O_{6.7}$, $Sr_{0.15}La_{1.85}CuO_{3.5}$ or the like.

As preferred compound oxide, it can be mentioned the following compound oxide represented by the general formula:

$$Ln_1Ba_2Cu_3O_{7-\delta}$$

in which, Ln stands for an element selected from a group comprising Y, La, Gd, Ho, Er, Tm, Yb and Lu, and $\delta$ is a number which satisfies $0<\delta<1$ and including the following systems:

$Y_1Ba_2Cu_3O_{7-x}$, $Ho_1Ba_2Cu_3O_{7-x}$, $Lu_1Ba_2Cu_3O_{7-x}$, $Sm_1Ba_2Cu_3O_{7-x}$, $Nd_1Ba_2Cu_3O_{7-x}$, $Gd_1Ba_2Cu_3O_{7-x}$, $Eu_1Ba_2Cu_3O_{7-x}$, $Er_1Ba_2Cu_3O_{7-x}$, $Dy_1Ba_2Cu_3O_{7-x}$, $Tm_1Ba_2Cu_3O_{7-x}$, $Yb_1Ba_2Cu_3O_{7-x}$, $La_1Ba_2Cu_3O_{7-x}$
$(La,Sr)_2CuO_{4-x}$ in which x is a number which satisfies a range of $0<x<1$.

Of course, the method of the present invention is applicable to the other compound oxides having another system including the following compound oxide represented by the formula:

$$\theta_4(\Phi_{1-q}Ca_q)_m Cu_n O_{p+r}$$

in which $\theta$ stands for Bi or Tl, $\Phi$ stands for Sr when $\theta$ is Bi and stands for Ba when $\theta$ is Tl, m and n are numbers each satisfying ranges of $6 \leq m \leq 10$ and $4 \leq n \leq 8$ respectively, $p=(6+m+n)$, q is a number which satisfies a range of $0<q<1$, and r is a number which satisfies a range of $-2 \leq r \leq +2$. This system is considered to be a single phase of the following compound oxide or a mixed phase consisting mainly thereof:

$Bi_4Sr_4Ca_4Cu_6O_{20-r}$, $Bi_2Sr_2Ca_2Cu_3O_{10-r}$,
$Tl_4Ba_4Ca_4Cu_6O_{20-r}$, $Tl_2Ba_2Ca_2Cu_3O_{10-r}$, in which r is a number which satisfies a range of $-2 \leq r \leq +2$.

The vapour source used in the physical vapour deposition is selected from any material that can produce the thin film of compound oxide on the substrate. For example, the vapour source or target may be prepared by a sintered product which is produced by the steps comprising mixing oxides, carbonates, nitrates or sulfonate of constituent elements such as Ba or Sr, La or Y and Cu, subjecting the resulting mixture to a preliminary heat-treatment so called preliminary sintering operation, and then subjecting the resulting preliminarily sinterd mass to the final sintering at a temperature of 700° to 1,500° C. As mentioned above, a portion of the mixture of constituent elements may be substituted by oxides, carbonates, nitrates or sulfonate of at least one of Al, Fe, Co, Ni, Zn, Ag, Ti.

The vapour source is preferably in a form of the sintered bock but may be also in a form of powder which can be produced by pulverizing the abovementioned preliminarily sintered mass or the finally sintered block. It is also possible to use a plurality of the vapour sources, for example two vapour sources such as a combination of $Ba_xY_yO_z$ (in which x, y and z are numbers each satisfying respective range of $1 \leq x \leq 5$, $1 \leq y \leq 15$ and $1 \leq z \leq 20$) and CuO a portion of which may be substituted by at least one of oxides of Al, Fe, Co, Ni, Zn, Ag and Ti. Although the vapour source or the target consists preferably of the sintered product, it is also possible to use oxides, carbonates, nitrates or sulfonate of the constituent elements of $\alpha$, $\beta$ and $\gamma$ which are not subjected to the sintering operation as they are.

The proportion of atomic ratio of constituent elements in the vapour source is preferably controlled or adjusted in consideration of evaporation rate or sputtering rate of constituent elements. For example, in case of a target for preparing a thin film of Ba-Y-Cu-O system compound oxide on a substrate, the proportion of Ba, Y and Cu in the target is determined on the base of difference in sputtering rate among Ba, Y and Cu.

The physical vapour deposition is preferably carried out in the presence of oxygen gas or reactive gas such as fluorine gas. In case of CVD process, a suitable carrier gas is used for carrying the constituent elements of the compound oxide or their compounds onto a substrate.

It is apparent from the description abovementioned that the method according to the present invention is advantageously applicable to mass production of small superconducting solenoids. In fact, according to the present invention, a large number of solenoids are produced on a common silicon wafer simultaneously and then are separated into individual solenoids by simple cutting operation.

Still more, when the substrate is made of semiconductor, the small solenoid according to the present invention can be integrated with another active elements and/or passive elements or devices on a common substrate.

The small solenoid produced according to the present invention can maintain a permanent current thereon, once a predetermined electric current is supplied to the ring-shaped superconducting thin film. Such permanent current can be supplied to the ring-shaped superconducting thin film by any one of known methods such as thermally controlled On-Off switching for permanent current, mechanical On-Off switching for permanent current or magnetically controlled switching.

The small superconducting solenoid produced according to the present invention is used in the field of small actuator, motor, electromagnetic valve, sensor, coil or similar devices which functions in relatively cheap cryogen such as liquidized nitrogen, hydrogen or neon.

Now, the method for producing a small superconducting solenoid according to the present invention will be described with reference to illustrative drawings, but the scope of the present invention should not be limited thereto.

BRIEF DESCRIPTION OF THE DRAWINGS

FIG. 1(a) to (d) are a series of cross sectional drawings for illustrating successive steps for producing a plurality of superconducting solenoids according to the present invention, in which FIG. 1(b) is a partial cross section taken along A—A line in FIG. 2.

Referring to FIG. 1(a) to (d) which illustrate a series of operations for producing a plurality of small solenoids on a common silicon wafer according to an embodiment of the present invention, sixty four small solenoids are produced on substrate of silicon wafer 1 in a parallel pattern as following.

Figure 2:
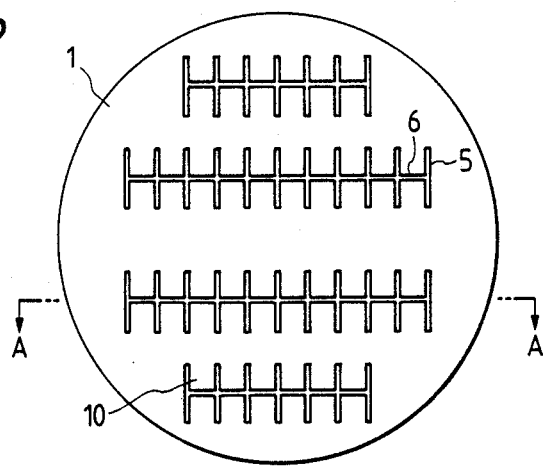
FIG. 2 is a plane view of a silicon wafer having a patterned slits in a manufacturing stage corresponding to FIG. 1(b).

In the special slit pattern shown in FIG. 2 which is a plane view of a silicon wafer, thirty six parallel slits 5 (vertical lines in FIG. 2) are cut in the substrate in such manner that eleven slits 5 which are in parallel with each other are cut near the center of the wafer (two rows) and seven parallel slits 5 are cut at opposite sides thereof (two rows). Each set of parallel slits 5 is crossed by another slit 6 (horizontal line in FIG. 2) which extends perpendicularly to the parallel slits 5 at an intermediate of the length of the slits 5. Therefore, after etching stage which will be explained hereinafter, sixty four core element 10 are supported cantilever-fashion in the silicon wafer in such manner that paired two core elements are faced to each other.

SLITTING STEP

At first, upper and lower surfaces of a silicon wafer substrate 1 having a diameter of 100 mm $\phi$ are coated with photoresist. The photoresist is exposed to a patterned light corresponding to the pattern of slits 5 and 6 shown in FIG. 2.

Figure 1A:
Figure 1B:
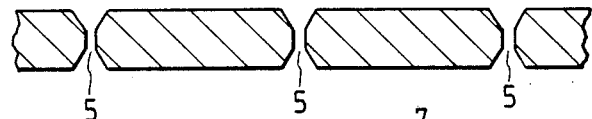

The silicon wafer having a cured resist pattern is then subjected to etching operation. Etching of the silicon wafer to cut the slits 5 and 6 is preferably carried out by two kinds of etching steps comprising anisotropic etching and isotropic etching. Namely, at first, a primary tapered groove or concave 2 having a cross section of a triangle (FIG. 1a) is cut in the silicon wafer 1 by anisotropic etching technique from upper and lower surfaces of the silicon wafer. Then, the primary groove or concave 2 is further dug along the direction of depth by isotropic etching technique to make a slit 5 which passes through the silicon wafer 1 (FIG. 1b). Each of the slit 5 has such a cross section as having two substantially semicircular enlarged concaves communicated to each other by a through-hole (as is shown in FIG. 1b).

Figure 1C:
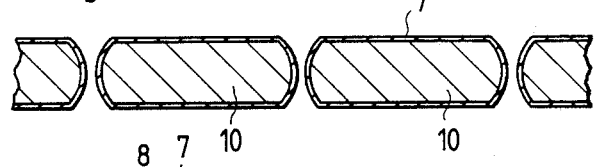
Figure 1D:
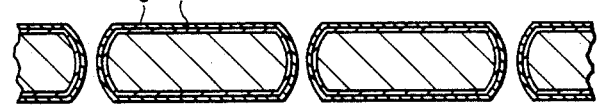

As mentioned above, the parallel slits 5 are crossed by another slit 6 which extends perpendicularly to the parallel slits 5, a plurality of core element 10 which are faced to each other and are supported cantilever-fashion parallelly in the silicon wafer are produced. After the etching operation complete, the core element 10 has a substantially round cylindrical cross section (FIG. 1(c)). In other words, a plurality of substantially cylindrical core elements are obtained. The slit pattern may have a pitch (the distance between adjacent slits) of 2 mm and each slit 5 may have a length or height of 10 mm.

The resulting silicon wafer 1 having an etched slits 5 and 6 is then heat-treated to produce a thin film layer 7 of insulator of silicon oxide which cover whole surface of the silicon wafer 1 and on which a thin film layer 8 of superconductor will be deposited in the next step.

Now, a process for preparing a target which is used for producing the superconducting thin film layer 8 is described.

PREPARATION OF A TARGET FOR SPUTTERING

Powders of $Ba_2CO_3$, $Y_2CO_3$ and CuO each having an average particle size of less than 5 μm and the purity of more than 3N are mixed in such a proportion that an atomic ratio of Ba:Y:Cu is 0.6:0.4:1. Then, the resulting powder mixture is subjected to a preliminary sintering at 820° C. for 12 hours. The resulting preliminary sintered cake-like mass is crushed and further pulverized in a ball mill by means of high purity zirconia balls to obtain a particle of less than 4 µm. The operations from sintering to pulverization are repeated for three times to produce a powder represented by the formula: $Ba_{0.6}Y_{0.4}CuO_{3-m}$. The resulting powder is charged in a rubber mold and compressed statically under a pressure of 1.5 ton/cm$_2$ to produce a disk of 90 $\phi \times 50$ mm.

SPUTTERING

A thin film is deposited on the silicon wafer 1 having the slits 5 and 6 by magnetron sputtering technique in which the sintered disk of compound oxide is used as a target. After the silicon wafer is secured on a substrate holder and the sintered disk is set on a target holder, vacuum of $5 \times 10{-1}$ Torr is created in a chamber. Sputtering is performed while the substrate holder is revolved on its own axis and about another axis so that a planetary motion is imparted to the silicon wafer. Operational conditions are as follow:

| | |
|---|---|
| Temperature of the substrate holder | 700° C. |
| High-frequency power | 100 to 300 W |
| Duration of sputtering | 60 min |
| Partial pressure of oxygen | $4 \times 10^{-2}$ Torr |
| Partial pressure of Ar | $3 \times 10^{-2}$ Torr |
| Thickness of deposited film | 0.2 to 1 µm |

After the sputtering complete, the whole surface of the core elements 10 is covered with a deposited thin film of compound oxide.

SEPARATION INTO INDIVIDUAL SUPERCONDUCTING SOLENOID

Then, the cylindrical core elements 10 having the thin film 8 of superconducting compound oxide thereon are cut off the silicon wafer body 1 by a cutter or slicer. A portion of the thin film deposited on a free end of the cylindrical core element is also cut off. Finally, sixty four cylindrical solenoid each comprising a cylindrical core and a ring-shaped superconductor of thin film are obtained.

DETERMINATION OF SUPERCONDUCTIVITY AND USE

After a pair of electrodes are connected to arbitrary two points on the thin film 8 of compound oxide of the resulting cylindrical solenoid by means of ordinary silver paste, the solenoid is submerged in liquidized nitrogen. Measurement of electric resistance on the resulting solenoid reveal that no resistance is observed.

The solenoid obtained can be used as a superconducting solenoid to which the permanent current can be supplied by a thermally controlled permanent current switching method.

I claim:
1. A method for producing a small superconducting solenoid by the steps comprising:
   providing a substrate of material which material will function as a solenoid core;
   etching at least two slits each slit having walls and each slit passing through the substrate to form a core which core is defined by the portion of the substrate between two adjacent slits;
   and then depositing a thin film of superconducting material of compound oxide including copper on at least predetermined portions of upper and lower surfaces of said substrate and on walls of said slits by physical vapour deposition technique so that a ring-shaped superconducting thin film is formed about said core.
2. Method set forth in claim 1, wherein said substrate is a wafer of silicon.
3. Method set forth in claim 1, wherein said slits are cut in the substrate in a pattern of parallel lines.
4. Method set forth in claim 1, wherein the remaining surface of said substrate where said thin film is not deposited is covered with a mask before the physical vapour deposition.
5. Method set forth in claim 1, wherein a plurality of small solenoids which are separable into individual solenoids are produced on a common substrate.
6. Method set forth in claim 1, wherein said thin film is deposited on the whole upper and lower surfaces of said substrate and on walls of said slits by physical vapour deposition technique, and then a part of said thin film deposited is removed in such manner that a ring-shaped thin film of superconductor is left only about the core.
7. Method set forth in claim 1, wherein said superconducting material is a compound oxide represented by the general formula:

$$(\alpha_{1-x}\beta_x)\gamma_yO_z$$

in which $\alpha$ stands for an element selected from IIa group of the Periodic Table, $\beta$ stands for an element selected from IIIa group of the Periodic Table and an element $\gamma$ stands for an element selected from a group comprising Ib, IIb, IIIb, IVb and VIII group of the Periodic Table, and x, y and z are numbers each having a range of $0.1 \leq x \leq 0.9$, $1.0 \leq y \leq 4.0$ and $1 \leq z \leq 5$ respectively.
8. Method set forth in claim 7, wherein said superconducting material is a compound oxide represented by the general formula:

$$Ln_1Ba_2Cu_3O_{7-\delta}$$

in which, Ln stands for an element selected from a group comprising Y, La, Gd, Ho, Er, Tm, Yb, Nd, Sm, Eu and Lu, $\delta$ is a number which satisfies a range of $0<\delta<1$.
9. Method set forth in claim 1, wherein said superconducting material is a compound oxide represented by the general formula:

$$\theta_4(\Phi_{1-q}Ca_q)_mCu_nO_{p+r}$$

in which $\theta$ stands for Bi or Tl, $\Phi$ stands for Sr when $\theta$ is Bi and stands for Ba when $\theta$ is Tl, m and n are numbers each satisfying ranges of $6 \leq m \leq 10$ and $4 \leq n \leq 8$ respectively, p=(6+m+n), q is a number which satisfies a range of $0<q<1$, and r is a number which satisfies a range of $-2 \leq r \leq +2$.
10. Method set forth in claim 1, wherein said substrate is made of a material selected from a group comprising MgO, SrTiO3, A12O3, sapphire, SiO2, quartz, YSZ and ZnO.
11. Method set forth in claim 1, wherein the etching is carried out by a combination of anisotropic etching technique and isotropic etching.
12. Method set forth in claim 1, wherein after said slits are cut in the substrate, the substrate is heat-treated to produce a thin film layer of oxide of the substrate.

* * * * *